(12) United States Patent
Hsu

(10) Patent No.: US 9,261,927 B2
(45) Date of Patent: Feb. 16, 2016

(54) ELECTRIC DEVICE

(71) Applicants: Inventec (Pudong) Technology Corporation, Shanghai (CN); INVENTEC CORPORATION, Taipei (TW)

(72) Inventor: Sheng-Chieh Hsu, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 169 days.

(21) Appl. No.: 14/230,008

(22) Filed: Mar. 31, 2014

(65) Prior Publication Data

US 2015/0153793 A1 Jun. 4, 2015

(30) Foreign Application Priority Data

Nov. 29, 2013 (CN) .......................... 2013 1 0629942

(51) Int. Cl.
*G06F 1/16* (2006.01)
*G06F 1/20* (2006.01)
*H05K 7/20* (2006.01)
*H01L 23/34* (2006.01)

(52) U.S. Cl.
CPC .............. *G06F 1/203* (2013.01); *G06F 1/1681* (2013.01); *H01L 23/34* (2013.01); *H05K 7/20* (2013.01)

(58) Field of Classification Search
CPC ........... G06F 1/20; G06F 1/203; G06F 1/206; G06F 1/1616; G06F 1/1658; H05K 7/20; H05K 7/14; H05K 7/209; H05K 7/20936; H05K 5/00; H05K 5/02; H01L 23/34; H01L 23/36; H01L 23/427; H01L 23/473; F28D 1/04; F28D 15/00; F28D 15/02; F28F 3/02; F28F 3/14
USPC .................. 361/679.46–679.55, 690–697, 361/700–714, 719–724; 165/80.2–80.5, 165/104.19, 104.26, 104.33, 104.34, 165/122–126, 185; 174/15.2, 16.3, 252, 174/520, 548
See application file for complete search history.

(56) References Cited

U.S. PATENT DOCUMENTS

| | | | | | |
|---|---|---|---|---|---|
| 5,568,360 | A | * | 10/1996 | Penniman | G06F 1/203 165/104.33 |
| 6,115,252 | A | * | 9/2000 | Ohta | G06F 1/203 165/80.4 |

(Continued)

FOREIGN PATENT DOCUMENTS

| CN | 201590960 U | 9/2010 |
|---|---|---|
| TW | 200846869 | 12/2008 |

(Continued)

*Primary Examiner* — Michail V Datskovskiy
(74) *Attorney, Agent, or Firm* — CKC & Partners Co., Ltd.

(57) ABSTRACT

An electric device provided includes a bottom case having an air outlet and an air inlet, a top cover combined with the bottom case, a fin set, a heat sink having a cold-end portion and a hot-end portion being opposite to each other, and a fan element. An accommodation space is defined between the bottom case and the top cover. The fin set is disposed in the accommodation space. The heat sink is disposed in the accommodation space, and the cold-end portion is adjacent to the air inlet, and the hot-end portion thereof is attached on a projection zone from the fin set to the top cover. The fan element draws airflows into the bottom case from the air in let for cooling the fin set and the hot-end portion.

10 Claims, 4 Drawing Sheets

(56) References Cited

U.S. PATENT DOCUMENTS

| | | | | |
|---|---|---|---|---|
| 6,529,375 B2* | 3/2003 | Miyahara | ............... | H01L 23/467 165/121 |
| 6,795,310 B2* | 9/2004 | Ghosh | ..................... | G06F 1/203 361/679.53 |
| 7,986,520 B2* | 7/2011 | Yamaguchi | ......... | F28D 15/0275 165/185 |
| 8,559,173 B2* | 10/2013 | Fujiwara | ................ | G06F 1/203 361/679.48 |
| 8,743,547 B2* | 6/2014 | Kim | ..................... | G06F 1/1633 174/15.2 |
| 9,116,674 B2* | 8/2015 | Merz | ................. | G02F 1/133308 |
| 9,125,300 B2* | 9/2015 | Yang | .................... | H05K 1/0203 |
| 2006/0114653 A1* | 6/2006 | Seto | ........................ | G06F 1/203 361/695 |
| 2012/0057301 A1* | 3/2012 | Tan | .................... | H05K 7/20809 361/697 |

FOREIGN PATENT DOCUMENTS

| | | |
|---|---|---|
| TW | 201021678 A | 6/2010 |
| TW | M460509 U | 8/2013 |

* cited by examiner

ELECTRIC DEVICE

RELATED APPLICATIONS

This application claims priority to Chinese Application Serial Number 201310629942.1, filed Nov. 29, 2013, which is herein incorporated by reference.

BACKGROUND

1. Field of Disclosure

The present disclosure relates to an electric device. More particularly, the present disclosure relates to an electric device having a heatsink therein.

2. Description of Related Art

A general way of cooling down high-frequency components (e.g., central processor and graphics chips etc.) in a notebook computer is to thermally contact the high-frequency components with a heat radiation fin set, so that heat energy generated from the high-frequency components can be thermally transferred to the heat radiation fin set. Next, a fan is provided to supply cold air to the heat radiation fin set for dissipating the heat energy from the heat radiation fin set. The cold air carries the heat energy to form hot air, which can be sent outwards from ventilation holes of a bottom case (e.g., a "D" piece as called in related industries) of the notebook computer.

However, because of the hot air having elevated temperature, the ventilation holes of the bottom case of the notebook computer might be increasingly heated. After heat energy of the ventilation holes is thermally conducted upwards to a top cover (e.g., a "C" piece as called in related industries) of the notebook computer, a certain area of the top cover right above the heat radiation fin set might be overly heated.

SUMMARY

In view of the above, an object of the present disclosure is to provide an electric device for solving the mentioned disadvantages existed in prior art, that is, a zone of the top cover of the notebook computer right above the heat fin set being overly heated.

In order to achieve the aforementioned object, according to an embodiment, an electric device includes a bottom case, a top cover, a fin set, a heat sink and a fan element. The bottom case comprises at least one air outlet and at least one air inlet. The top cover is combined with the bottom case, so that an accommodation space is defined between the bottom case and the top cover. The fin set is disposed in the accommodation space. The heat sink is disposed in the accommodation space, and the heat sink comprises a hot-end portion and a cold-end portion. The hot-end portion is attached on a projection zone from the fin set to the top cover. The cold-end portion is adjacent to the air inlet. The fan element draws airflows into the bottom case from the air inlet so as to cool the fin set and the hot-end portion.

Therefore, since the heat energy of the fin set is thermally transported to the top cover, the heat energy on the top cover can be thermally conducted to the cold-end portion of the heat sink from the hot-end portion thereof, at this moment, when the fan element draws the airflows into the bottom case from the air inlet, the airflows carry a part of the heat energy on the heat sink so as to accelerate the heat energy transported from the hot-end portion of the heat sink to the cold-end portion thereof, and enhance the performance of thermal conductivity of the heat sink, thereby, decreasing the temperature of the bottom case neighboring the air outlet, and overcoming the zone of the top cover right above the heat fin set being overly heated.

According to one or more embodiments, the top cover comprises a metal outer cover and a plastic plate. The plastic plate is disposed on an inner surface of the metal outer cover facing the accommodation space, and is provided with a hollow portion through which the inner surface of the metal outer cover is exposed. The hot-end portion of the heat sink is in physical contact with the part of the inner surface of the metal outer cover in the hollow portion.

According to one or more embodiments, the bottom case comprises a case body and a lateral cover, in which the air outlet is formed on one side of the case body, and the lateral cover is disposed on the other side of the case body, and the air inlet is formed on the lateral cover.

Furthermore, according to one or more embodiments, the heat sink comprises a sheet and a fence structure. The fence structure is located at the cold-end portion of the heat sink, and stands on one surface of the sheet, and physically contacts the lateral cover. Furthermore, the fence structure comprises at least one opening, and the opening is linearly aligned with the air inlet.

Furthermore, according to one or more embodiments, the heat sink comprises a plurality of heat sink bars. The heat sink bars are located at the cold-end portion thereof, and are arranged separately with each other, and respectively stand on the surface of the sheet, wherein the heat sink bars are disposed apart from the fence structure.

Also, according to one or more embodiments, when the number of the opening is plural, the heat sink bars are linearly aligned with the openings, respectively.

Also, according to one or more embodiments, the electric device further comprises an electronic element. The electronic element is disposed in the case body, and in thermal contact with the fin set.

According to one or more embodiments, the case body is provided with a recess portion. The recess portion is disposed on the other side of case body, and the lateral cover is disposed in the recess portion.

According to one or more embodiments, the electric device further comprises a hinge. The hinge is disposed in the recess portion, and the lateral cover is disposed between the hinge and the heat sink.

As what has been disclosed above, by the technical solution provided by the present disclosure, after the heat energy accumulated on the projection zone from the fin set to the top cover is thermally conducted towards the air inlet of the bottom case via the heat sink, the airflows drawn into the bottom case from the air inlet can take partial heat energy of the heat sink away. Therefore, a circulation of thermal conductivity between the fin set and the air outlet of the bottom case is provided so as to decrease the surface temperatures of the heat sink, the fin set and the top cover, and to overcome the zone of the top cover right above the heat fin set being overly heated therefore to further increase the product life of the electric device.

The above description is merely used for illustrating the problems to be resolved, the technical methods for resolving the problems and their efficacies, etc. The specific details of the present disclosure will be explained in the below embodiments and related drawings.

BRIEF DESCRIPTION OF THE DRAWINGS

The disclosure may be more fully understood by reading the following detailed description of the embodiment, with reference made to the accompanying drawings as follows.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

Figure 1:
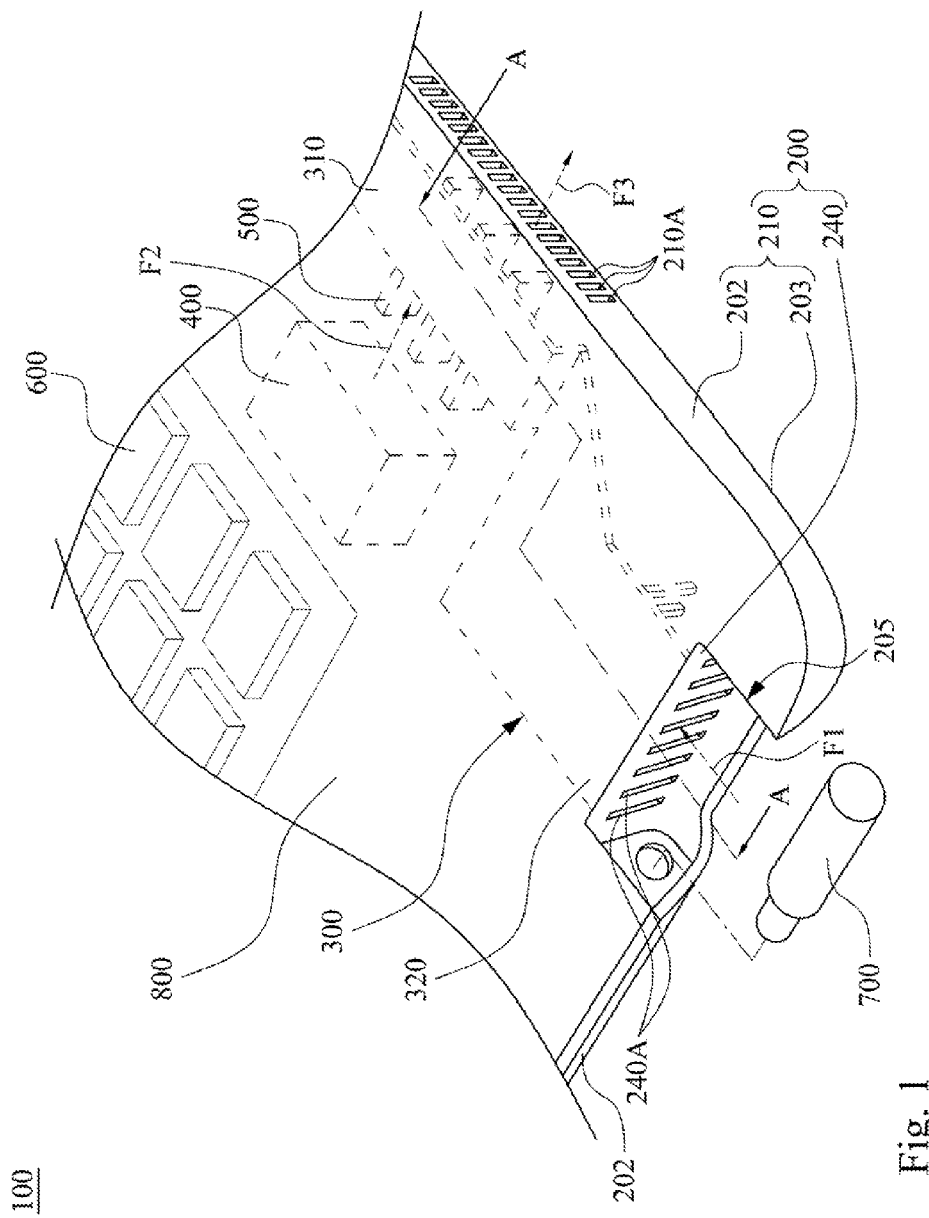
FIG. 1 is a partial perspective view illustrating an electric device according to an embodiment of the disclosure.
Figure 2:
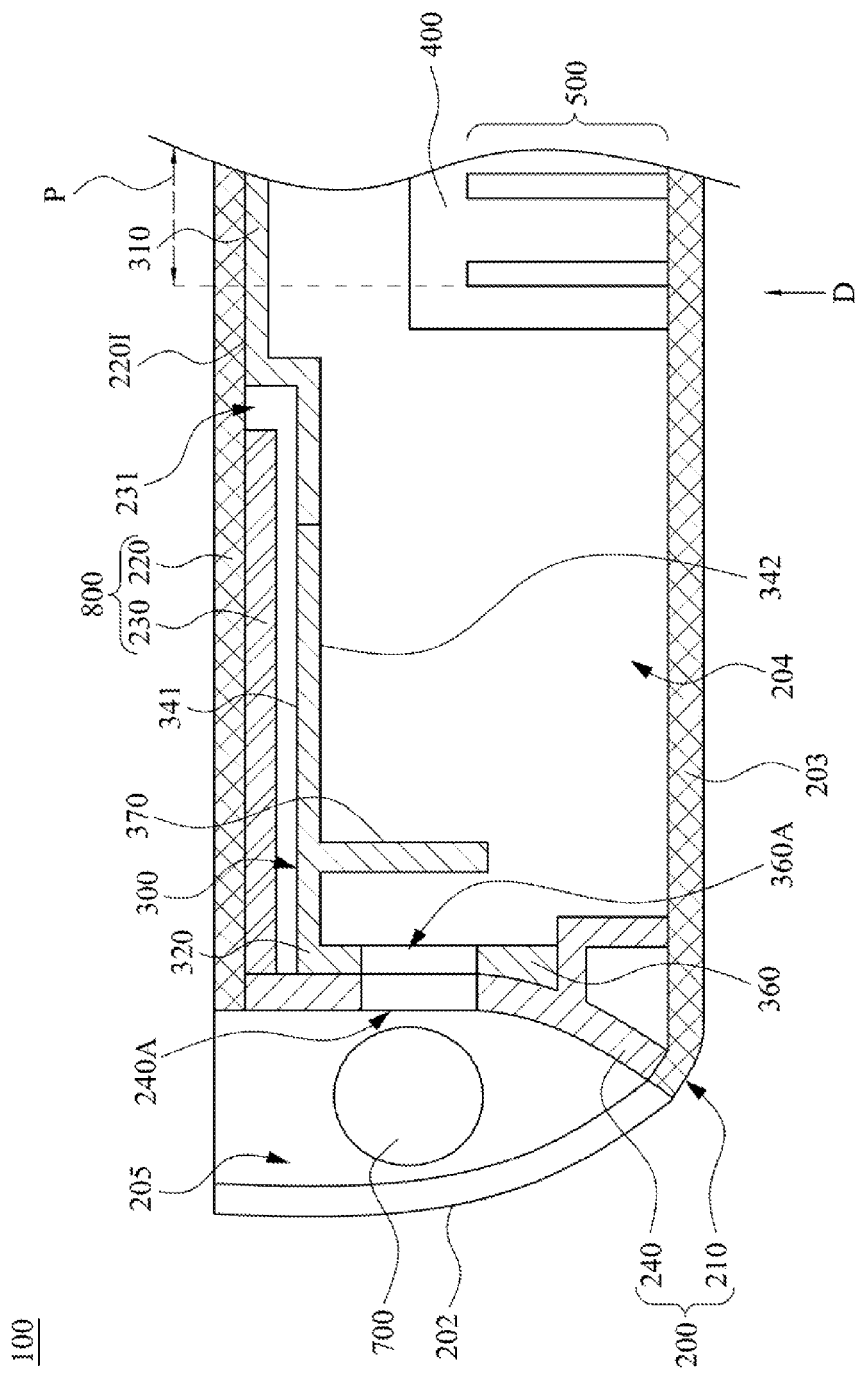
FIG. 2 is a cross sectional view of FIG. 1 taken along line A-A.

Reference is now made to FIG. 1 and FIG. 2 in which FIG. 1 is a partial perspective view illustrating an electric device 100 according to an embodiment of the disclosure, and FIG. 2 is a cross sectional view of FIG. 1 taken along line A-A. As shown in FIG. 1 and FIG. 2, the electric device 100 includes a top cover 800 (e.g., a "C" piece as called in related industries), a bottom case 200 (e.g., a "D" piece as called in related industries), a fin set 500, a heat sink 300 and a fan element 400. The bottom case 200 is combined with the top cover 800, so that an accommodation space 204 (FIG. 2) is defined between the bottom case 200 and the top cover 800. The bottom case 200 includes a number of air outlets 210A and air inlets 240A. The fin set 500, the heat sink 300 and the fan element 400 are respectively disposed in the accommodation space 204. The heat sink 300 includes a hot-end portion 310 and a cold-end portion 320 which are arranged oppositely with each other. The cold-end portion 320 is adjacent to, or substantially disposed on the air inlets 240A, and the hot-end portion 310 is adjacent to, or substantially disposed on the air outlets 210A. Substantially, the hot-end portion 310 is attached on a projection zone P from the fin set 500 to the top cover 800. When the fan element 400 is operated, the fan element 400 draws airflows F1 (e.g., cold air) into the bottom case 200 via the air inlets 240A from the external of the bottom case 200, and the fan element 400 blows airflows F2 to the hot-end portion 310 and the fin set 500 so as to cool the hot-end portion 310 and the fin set 500. After the airflows F2 passes through the hot-end portion 310 and the fin set 500, airflows F3 (e.g., hot air) are formed therefore, and the airflows F3 are sent outwards from the bottom case 200 via the air outlets 210A.

Thus, no matter the airflows F3 which are passed through the hot-end portion 310 and the fin set 500 cause the projection zone P of the top cover 800 overly heated, or the heat energy which is thermally transported to the top cover 800 from the fin set 500 causes the projection zone P of the top cover 800 overly heated, by the electric device 100 of the present disclosure, the heat energy on the projection zone P of the top cover 800 can be conducted to the cold-end portion 320 via the hot-end portion 310. Meanwhile, when the fan element 400 draws the airflows F1 having cold air therein into the bottom case 200 from the air inlets 240A, the airflows F1 having cold air therein take partial of heat energy from the cold-end portion 320 so as to accelerate the heat energy to the cold-end portion 320 thereof, and enhance the performance of thermal conductivity of the heat sink 300, thereby, overcoming the zone of the top cover 800 right above the heat fin set 500 being overly heated.

In the embodiment, since the heat fin set 500 is in thermal contact with at least one electronic element (e.g., a central processing unit or a graphics processing unit, not shown in figures) installed inside the bottom case 200 of the electric deice 100, and the heat fin set 500 is arranged between the fan element 400 and the air outlets 210A, thus, after the heat energy of the electronic element is transported to the heat fin set 500, the fan element 400 blows the airflows F2 to the heat fin set 500 to carry a part of the heat energy away, and the airflows F2 then are discharged outwards from the bottom case 200 of the electric deice 100 via the air outlets 210A after passing through the hot-end portion 310 of the heat sink 300. However, the rest of the heat energy on the heat fin set 500 still can be thermally transported by thermal convection to the projection zone P of the top cover 800, or when the temperature of the air outlets 210A rises, heat energy around the air outlets 210A of the bottom case 200 still can be thermally conducted to the top cover 800, thus, heat energy on the projection zone P of the top cover 800 is guided to the cold-end portion 320 of the heat sink 300 from the hot-end portion 310 thereof.

As shown in FIG. 2, the bottom case 200 includes a case body 210 and a lateral cover 240. The air outlets 210A can be formed on anyone of sides of the case body 210, and the lateral cover 240 is assembled to one of the sides of the case body 210, and the air inlets 240A are formed on the lateral cover 240. The air inlets 240A and the air outlets 210A are respectively formed on the different sides of the case body 210, for example, referring to FIG. 2, the two sides of the case body 210 respectively forming the air inlets 240A and the air outlets 210A are adjacent to each other. Thus, since the air inlets 240A and the air outlets 210A are separately arranged with each other to keep a proper distance therebetween so that when a neighborhood of the air outlets 210A is heated due to the discharged airflows with hot air, the heat energy is not easy to reflow back to the air inlets 240A of the lateral cover 240 so as to avoid from degrading the performance of the thermal conductivity of the heat sink 300.

However, it is noted that the air inlets and the air outlets in other embodiment still can be arranged on the same side of the case body as long as the air inlets and the air outlets are separated in a proper distance.

Specifically, as shown in FIG. 1, the case body 210 includes a plurality of lateral portions 202 and a base portion 203. The base portion 203 is opposite to the top cover 800, and the lateral portions 202 surround the base portion 203, so that the aforementioned accommodation space 204 (FIG. 2) is defined by the top cover 800, the base portion 203 and the lateral portions 202 mutually. The base portion 203 is used for being placed on a flat plane (not shown in figures). The air outlets 210A are arranged linearly at intervals on one lateral portion 202 of the case body 210, and the lateral cover 240 is assembled to another lateral portion 202 of the case body 210 in which the two lateral portions 202 mentioned above are adjacent to each other. The air inlets 240A are arranged linearly at intervals on the lateral cover 240. The top cover 800 is allowed to assemble onto the lateral portions 202, and the top cover 800 can support a keyboard device 600 thereon.

Moreover, for example, the another lateral portion 202 of the case body 210 is further provided with a recess portion 205 for receiving a hinge 700 therein, and the lateral cover 240 therefore can be selected as a hinge cover arranged between the hinge 700 and the heat sink 300 so as to partition the hinge 700 from elements in the aforementioned accommodation space 204. Generally, the recess portion 205 is extended towards the aforementioned accommodation space 204 from another lateral portion 202, and the lateral cover 240 is disposed in the recess portion 205, and is sandwiched between the top cover 800 and the base portion 203. Also, in the embodiment, the lateral cover 240 can be assembled on the case body 210 with a conventional fastening mechanism; however, the disclosure is not limited thereto.

In the embodiment, the electric device 100 for example, is a notebook computer, and the electric device 100 includes a display unit (not shown in figures), the bottom case 200 and the display unit are pivoted with each other by the hinge 700 so that the bottom case 200 can be rotated in relative to the display unit. However, the disclosure is not limited thereto.

Figure 3:
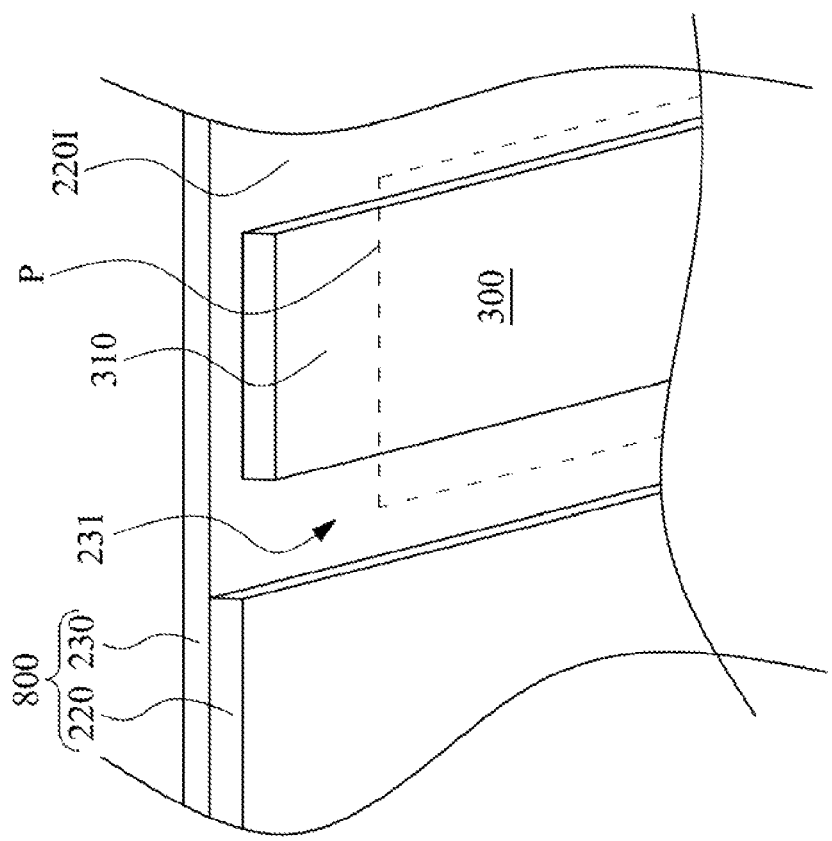
FIG. 3 is a partial schematic view illustrating an inner surface of a top cover of FIG. 2 viewed from a direction D.

FIG. 3 is a partial schematic view illustrating an inner surface of a top cover 800 of FIG. 2 viewed from a direction D. Furthermore, refer to FIG. 2 and FIG. 3, the top cover 800 includes a metal outer cover 220 and a plastic plate 230. The plastic plate 230 is disposed on an inner surface 220I of the metal outer cover 220 facing the accommodation space 204, and the plastic plate 230 is provided with a hollow portion 231 through which the inner surface 220I of the metal outer cover 220 is exposed. The hot-end portion 310 of the heat sink 300 is in physical contact with the part of the inner surface 220I of the metal outer cover 220 in the hollow portion 231. More particularly, in this embodiment, as shown in FIG. 2, the hollow portion 231 of the plastic plate 230 is disposed right above the heat fin set 500, that is, the hollow portion 231 of the plastic plate 230 is located at the projection zone P from the fin set 500 to the top cover 800 so that the heat energy on the heat fin set 500 can be directly risen by thermal convection to a part of the metal outer cover 220 unveiled from the hollow portion 231.

When manufacturing the top cover 800, the personnel partly first hollows the plastic plate 230 in a predetermined area to form the hollow portion 231 through which the inner surface 220I of the metal outer cover 220 is exposed, next, the personnel attaches the hot-end portion 310 of the heat sink 300 to physically contact the inner surface 220I of the metal outer cover 220 in the hollow portion 231.

When the hot air or the heat energy of the heat fin set 500 causes the temperature of the metal outer cover 220 of the top cover 800 increased, because the hot-end portion 310 of the heat sink 300 is in physical contact with the metal outer cover 220, heat energy transported to the hot-end portion 310 of the heat sink 300 from the metal outer cover 220 can be rapidly conducted to the cold-end portion 320 of the heat sink 300 so as to decrease the temperature of the area of top cover 800 aligned straight to the heat fin set 500 or the temperature of the neighborhood of the air outlets 210A of the bottom case 200.

Figure 4:
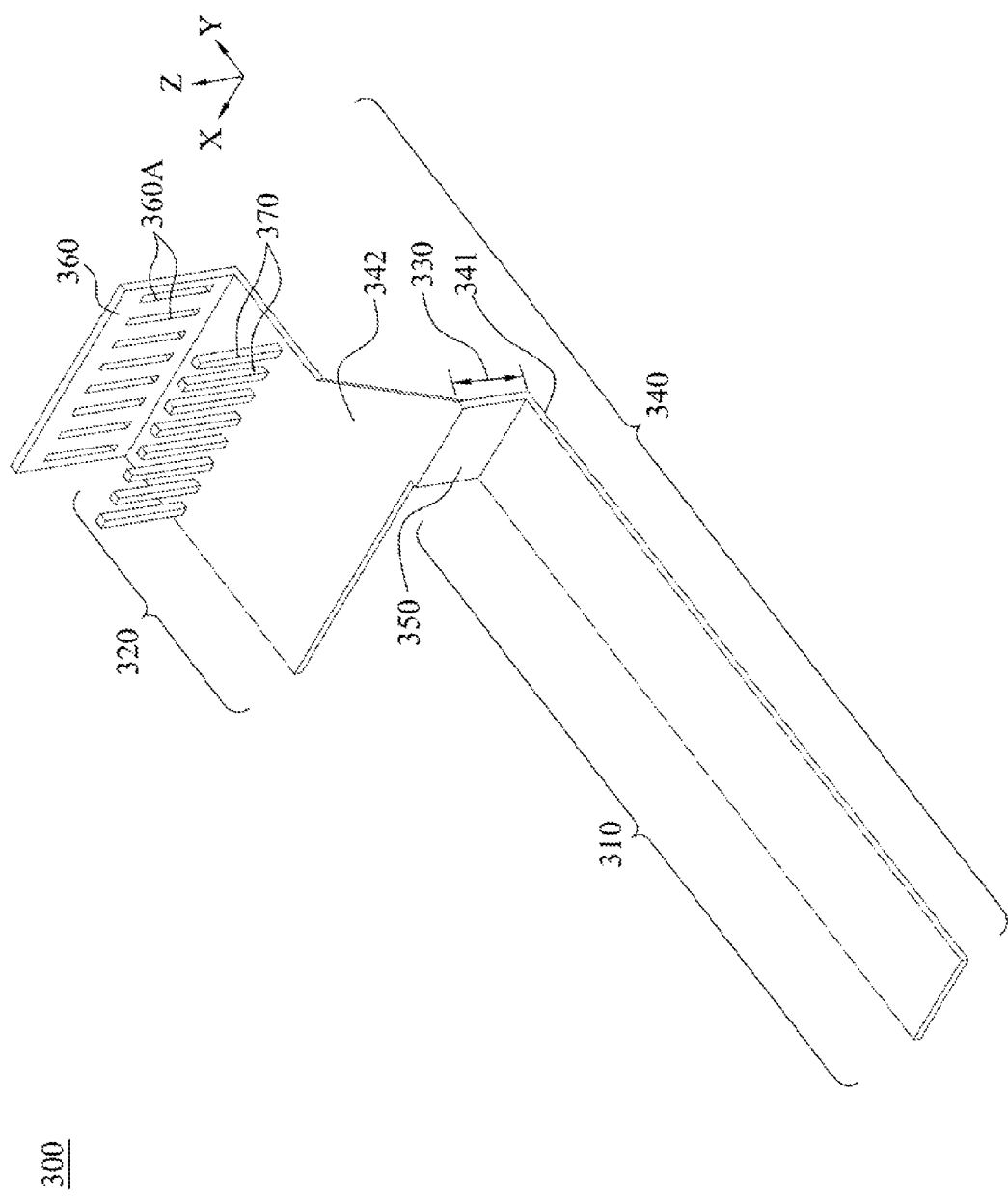
FIG. 4 is a perspective view illustrating a heat sink of FIG. 1.

FIG. 4 is a perspective view illustrating a heat sink of FIG. 1. As shown in FIG. 4 and FIG. 2, the heat sink 300 includes a sheet 340, a bending portion 350 and a fence structure 360. The sheet 340 is in an elongate shape, and the sheet 340 includes a first surface 341 and a second surface 342 opposite to the first surface 341. The hot-end portion 310 and the cold-end portion 320 are respectively located at two opposite end portions of the sheet 340, and a length of the hot-end portion 310 is greater than a length of the cold-end portion 320, and a width of the cold-end portion 320 is greater than a width of the hot-end portion 310. The bending portion 350 is extended in a height direction (i.e., Z-axis), and is interposed between the hot-end portion 310 and the cold-end portion 320. As the bending portion 350 connecting the hot-end portion 310 and the cold-end portion 320, the hot-end portion 310 and the cold-end portion 320 are non-planar (e.g., not on XY plane) so as to keep a vertical gap 330 between the hot-end portion 310 and the cold-end portion 320. Specifically, the first surface 341 of the sheet 340 faces towards the top cover 800, and the second surface 342 of the sheet 340 faces towards the base portion 203 of the case body 210 (FIG. 2). The hot-end portion 310 physically contacts a part of the metal outer cover 220 in the hollow portion 231 through the first surface 341 of the sheet 340. The fence structure 360 is located at the cold-end portion 320 of the heat sink 300, and stands on the second surface 342 of the sheet 340, and extends in a direction (i.e., Z-axis) towards the base portion 203 of the case body 210 (FIG. 2). The fence structure 360 physically contacts the lateral cover 240, for example, the fence structure 360 is in surface contact with the lateral cover 240 physically. In this embodiment, the fence structure 360 comprises a plurality of openings 360A. The openings 360A are arranged at intervals, and linearly aligned with the air inlets 240A (FIG. 2) one by one, so as to enhance airflows F to the fan element 400.

Therefore, since the fence structure 360 physically contacts the lateral cover 240, the heat energy on the fence structure 360 can be thermally conducted to the lateral cover 240, and then, the heat energy on the lateral cover 240 can be transported outwards by thermal convection. Also, since the openings 360A are linearly aligned with the air inlets 240A (FIG. 2) of the lateral cover 240 one by one, when the airflows F1 (FIG. 1) having cold air enter into the bottom case 200 (i.e., accommodation space 204) through the air inlets 240A and the openings 360A, the airflows F1 are capable of partially carrying the heat energy of the fence structure 360 away after moved through the fence structure 360 so as to enhance the thermal dissipation performance of the heat sink 300.

For further increasing the thermal dissipation performance of the heat sink 300, the heat sink 300 further comprises at least one heat sink bar 370. The heat sink bar 370 is located at the cold-end portion 320 of the heat sink 300 so as to increase the thermal dissipation area of the cold-end portion 320 of the heat sink 300.

Furthermore, when the number of the heat sink bars 370 is plural, these heat sink bars 370 respectively stand upright at intervals on the second surface 342 of the sheet 340, and arranged on the second surface 342 of the sheet 340 in a linear direction (e.g., X-axis). The linear direction and a lengthwise direction (e.g., Y-axis) of the hot-end portion 310 are intercrossed with each other. Also, these heat sink bars 370 are linearly aligned with the openings 360A one by one for directly confronting the airflows sent inwards via the air inlets 240A and the openings 360A in order to carry the heat energy thermally conducted on the heat sink bars 370 away from the heat sink bars 370 for enhancing the thermal dissipation performance of the heat sink 300.

For maximizing the thermal dissipation performance of the heat sink 300, a lengthwise direction (e.g., Z-axis) of each of the heat sink bars 370 is orthogonal to an axial direction (e.g., Y-axis) of each of the openings 360A Thus, when a projection area from a main surface of one of the heat sink bars 370 to the fence structure 360 is exactly same as the area of the said main surface of the heat sink bar 370 itself, it implies that the entire area of the said main surface of the heat sink bar 370 can simultaneously receive the maximum volume of cold airflows passing though the heat sink bar 370, so that the thermal dissipation performance of the heat sink bars 370 is therefore maximized.

When manufacturing the heat sink 300, the sheet 340, the bending portion 350, the fence structure 360 and the heat sink bars 370 are formed integrally in one, for example, the personnel first bunches out the openings 360A on the cold-end portion 320 of the heat sink 300, next, the personnel outwardly bends the fence structure 360 and the heat sink bars 370 so that the fence structure 360 and the heat sink bars 370 respectively stand upright on the second surface 342 of the sheet 340.

In the embodiment, the sorts of the material of the heat sink 300 can be, for example, silver, copper, gold, nickel, aluminum, tin, chromium, titanium, iron or an alloy thereof, however, the present disclosure is not limited thereto.

As what has been disclosed above, by the technical solution provided by the present disclosure, the heat energy accumulated on the top cover right above the heat fin set or the neighborhood of the air outlets of the bottom case can be transported to the air inlets of the bottom case by the heat sink, after that, the airflows drawn from the air inlets carry the heat energy of the heat sink away. Therefore, a circulation of thermal conductivity between the fin set and the air outlet of the bottom case is provided, so as to decrease the surface temperatures of the bottom case and the top cover, therefore, to further increase the product life of the electric device.

Finally, the embodiments in the foregoing is not used for limiting the present disclosure, various modifications and variations may be made to the structure of the present disclosure are protected in the present disclosure by those skilled in this art without departing from the scope or spirit of the disclosure. Therefore, the scope of patent protection of the present disclosure is based on the scope of the attached patents.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electric device, comprising:
   a bottom case having at least one air outlet and at least one air inlet;
   a top cover combined with the bottom case, such that an accommodation space is defined between the bottom case and the top cover;
   a fin set disposed in the accommodation space;
   a heat sink disposed in the accommodation space, comprising:
      a hot-end portion attached on a projection zone from the fin set to the top cover; and
      a cold-end portion being adjacent to the air inlet; and
   a fan element drawing airflows into the bottom case from the air inlet so as to cool the fin set and the hot-end portion.

2. The electric device of claim 1, wherein the top cover comprises:
   a metal outer cover; and
   a plastic plate disposed on an inner surface of the metal outer cover facing the accommodation space, and having a hollow portion through which the inner surface of the metal outer cover is exposed,
   wherein the hot-end portion of the heat sink is in physical contact with the part of the inner surface of the metal outer cover in the hollow portion.

3. The electric device of claim 1, wherein the bottom case comprises:
   a case body, the air outlet is formed on one side of the case body; and
   a lateral cover disposed on the other de of the case body, wherein the air inlet is formed on the lateral cover.

4. The electric device of claim 3, wherein the heat sink comprises:
   a sheet; and
   a fence structure located at the cold-end portion of the heat sink, standing on one surface of the sheet, and in physical contact with the lateral cover.

5. The electric device of claim 4, wherein the fence structure comprises at least one opening, and the at least one opening is linearly aligned with the air inlet.

6. The electric device of claim 5, wherein the heat sink comprises:
   a plurality of heat sink bars located at the cold-end portion thereof, arranged separately with each other, and respectively standing on the surface of the sheet, wherein the heat sink bars are disposed apart from the fence structure.

7. The electric device of claim 5, wherein when the number of the at least one opening is plural, the heat sink bars are linearly aligned with the openings, respectively.

8. The electric device of claim 3, further comprising:
   an electronic element disposed in the case body, and in thermal contact with the fin set.

9. The electric device of claim 3, wherein the case body is provided with a recess portion on the other side thereof, wherein the lateral cover is disposed in the recess portion.

10. The electric device of claim 9, further comprising:
    a hinge disposed in the recess portion, wherein the lateral cover is disposed between the hinge and the heat sink.

* * * * *